United States Patent
Jestin et al.

(10) Patent No.: US 9,768,629 B2
(45) Date of Patent: Sep. 19, 2017

(54) METHOD FOR CHARGING A BATTERY AND BATTERY THUS CHARGED

(71) Applicant: Blue Solutions, Ergue Gaberic (FR)

(72) Inventors: Jean-Jacques Jestin, Fouesnant (FR); Dominique Hingant, Saint-Yvi (FR)

(73) Assignee: Blue Solutions (FR)

( * ) Notice: Subject to any disclaimer, the term of this patent is extended or adjusted under 35 U.S.C. 154(b) by 205 days.

(21) Appl. No.: 14/413,539

(22) PCT Filed: Jul. 2, 2013

(86) PCT No.: PCT/EP2013/063975
§ 371 (c)(1),
(2) Date: Jan. 8, 2015

(87) PCT Pub. No.: WO2014/009211
PCT Pub. Date: Jan. 16, 2014

(65) Prior Publication Data
US 2015/0162769 A1    Jun. 11, 2015

(30) Foreign Application Priority Data

Jul. 10, 2012   (FR) ...................................... 12 56625

(51) Int. Cl.
*H02J 7/00* (2006.01)
*G05F 1/00* (2006.01)
(Continued)

(52) U.S. Cl.
CPC .......... *H02J 7/0052* (2013.01); *G01R 31/043* (2013.01); *G01R 31/3648* (2013.01);
(Continued)

(58) Field of Classification Search
CPC ........ Y02E 60/12; Y02E 60/13; H02J 7/0022; H02J 7/0068; H02J 7/0073; H02J 7/0052;
(Continued)

(56) References Cited

U.S. PATENT DOCUMENTS 5,283,512 A * 2/1994 Stadnick ............... H02J 7/0016
                                                       320/101
5,656,915 A * 8/1997 Eaves ................. H01M 10/482
                                                       320/118

(Continued)

FOREIGN PATENT DOCUMENTS

RU    2364992 C2    8/2009
WO    2008009502 A1    1/2008

OTHER PUBLICATIONS

International Search Report for Application No. PCT/EP2013/063975 dated Nov. 6, 2013.

*Primary Examiner* — Richard Isla Rodas
*Assistant Examiner* — Mohammed J Sharief
(74) *Attorney, Agent, or Firm* — Lerner, David, Littenberg, Krumholz & Mentlik, LLP

(57) ABSTRACT

The invention relates to a method for charging a battery comprising rechargeable cells. According to the invention, to perform the ith charge of the battery, where i≥2, connection of the charging terminals to the charger is detected triggering connection of the cells to their bypass circuit during a pre-emptive bypass time ($TP_{ji}$). Next, for each cell, during a second phase ($C_{ji}$), the bypass circuit is disconnected from the cell until the voltage of the cell reaches a preset voltage, the pre-emptive bypass time ($TP_{ji}$) for the ith charge having been calculated as a function of the total connection time, during at least one preceding charge, of the bypass circuit associated with this cell, until all the cells have reached the preset voltage. At least one length of time allowing the first time ($TP_{ji}$) for the ith charge and/or said total connection time to be determined was memorized in a memory of the battery during this at least one preceding charge.

15 Claims, 4 Drawing Sheets

Figure 1:
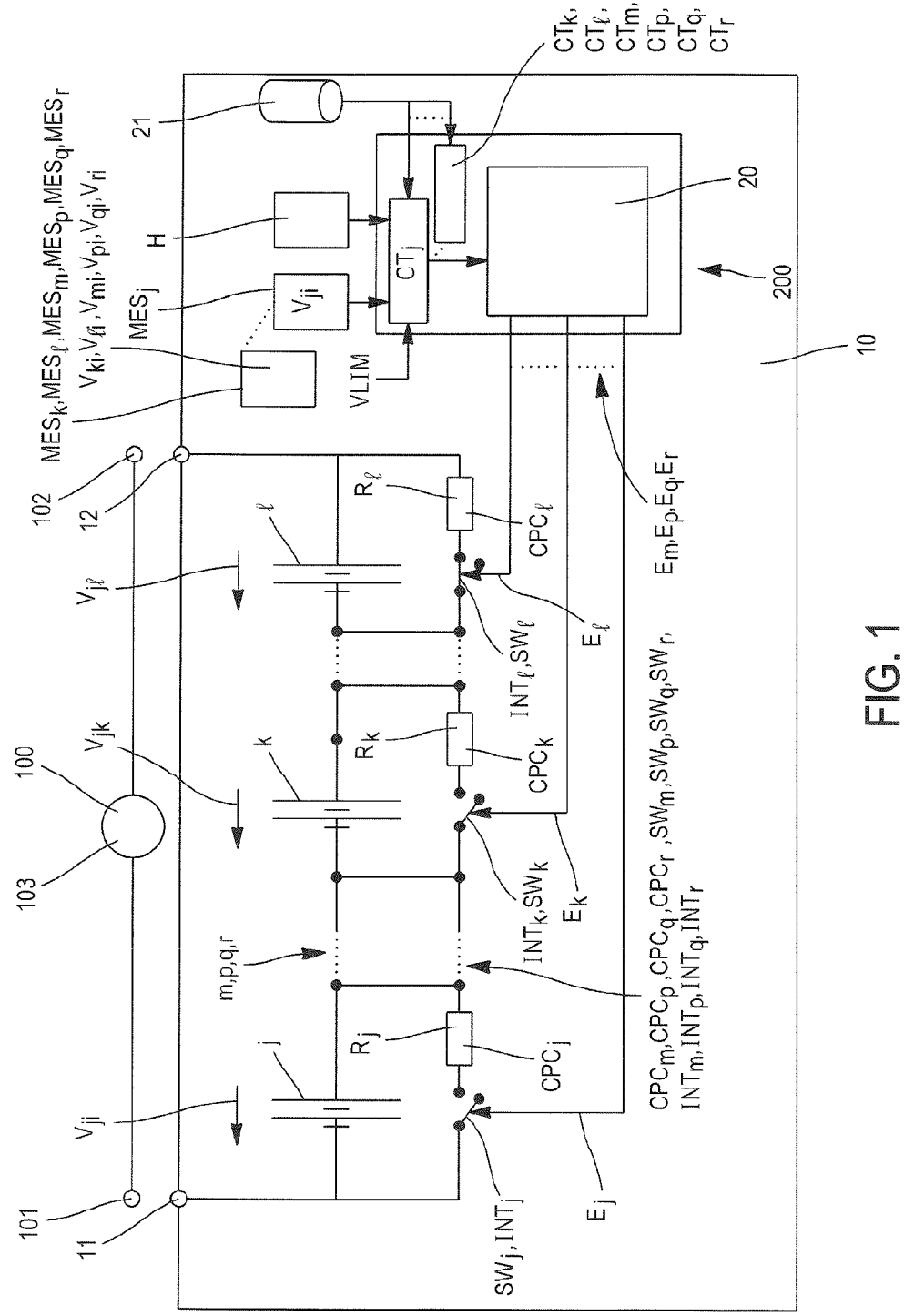

(51) Int. Cl.
*G08B 21/00* (2006.01)
*G01R 31/04* (2006.01)
*G01R 31/36* (2006.01)
*H01M 10/42* (2006.01)
*H01M 10/44* (2006.01)

(52) U.S. Cl.
CPC ..... *H01M 10/4257* (2013.01); *H01M 10/441* (2013.01); *H02J 7/0016* (2013.01); *H01M 2010/4271* (2013.01); *Y02T 10/7055* (2013.01)

(58) Field of Classification Search
CPC ........ H02J 7/0016; H02J 7/345; H02J 7/0047; H01M 10/44; H01M 10/441; H01M 10/4257; H01M 2010/4271; Y02T 10/7055; H02M 3/07; H02M 3/33507; H02M 3/1588; H02M 3/156; H02M 3/158; H02M 3/1582; H02M 3/157; H02M 2001/0012; Y02B 70/1466; G01R 31/043; G01R 31/3682; G01R 31/3624; G01R 31/3648; G01R 31/3655

USPC ................ 320/137, 122, 166; 323/271, 283; 340/636.12, 636.15
See application file for complete search history.

(56) References Cited

U.S. PATENT DOCUMENTS

| | | | | |
|---|---|---|---|---|
| 5,767,659 | A * | 6/1998 | Farley | H01M 10/46 320/106 |
| 2002/0094623 | A1 | 7/2002 | Okamura | |
| 2006/0269312 | A1 * | 11/2006 | Muraishi | G03G 15/5004 399/88 |
| 2011/0012566 | A1 | 1/2011 | Sasaki | |
| 2013/0049673 | A1 * | 2/2013 | Agarwal | H02J 7/0016 320/101 |
| 2013/0200850 | A1 * | 8/2013 | Ke | H02J 7/0016 320/118 |
| 2013/0300370 | A1 * | 11/2013 | Hotta | H01M 10/425 320/117 |

* cited by examiner

METHOD FOR CHARGING A BATTERY AND BATTERY THUS CHARGED

CROSS REFERENCE TO RELATED APPLICATIONS

The present application is a national phase entry under 35 U.S.C. §371 of International Application No. PCT/EP2013/063975, filed Jul. 2, 2013, published in French, which claims priority from French Patent Application No. 1256625, filed Jul. 10, 2012, the disclosures of which are incorporated by reference herein.

The invention relates to electric batteries and to a method for the charging thereof.

One field of application of the invention concerns power batteries such as those used for example as energy source to power a driveline in electric vehicles. This type of battery on board an electric vehicle contains cells of lithium-metal-polymer technology for example.

Evidently, the battery may have other applications for example to power fixed equipment and may comprise cells using another technology e.g. lithium-ion technology.

These batteries are generally formed of a plurality of elementary cells connected in series which can be charged by connecting them to an adapted charger.

Each of the cells has its own intrinsic properties which may differ from the properties of the other cells.

However, charging of the battery is performed using a single power source i.e. the charger.

In general, in known methods some cells already fully charged continue to be charged for as long as all the other cells have not reached their maximum charge level.

Yet when charging the battery, continuing to supply power to cells which have already reached their maximum level could degrade the properties thereof and in particular may accelerate their ageing.

Document US 2002/0094623 describes a method for charging a battery comprising a plurality of rechargeable cells, charging terminals for the cells able to be connected to a charger, a bypass circuit associated with each cell, switching elements allowing the connection and disconnection of each cell to and from its associated bypass circuit and means for controlling the switching elements, a method wherein, to charge the battery cells, the charging terminals of the cells are connected to a charger and via the switching elements each cell is connected to its associated bypass circuit for a predetermined length of time.

More specifically, the charging method according to this document US 2002/0094623 successively provides for a step to charge each cell until a given initialisation voltage is reached, an initialisation step with bypassing of the cell by a circuit for the predetermined length of time, a step for normal charging until a complete charge voltage is reached and a relaxation step via constant voltage charging.

One of the disadvantages of this known method is that each cell continues to progress in different manner to the other cells.

Another disadvantage is that a non-negligible current is passed during the initialisation step with bypassing.

A further disadvantage is that the initialisation step with bypassing is performed once charging has already largely begun, reaching an initialisation voltage of 2.2 V (for a full charge voltage of 3 V).

The invention sets out to obtain a battery and a method for charging a battery which overcomes the prior art disadvantages and allows the driving of each different cell when the battery is being charged.

For this purpose a first subject of the invention is a method for charging a battery, the battery comprising a plurality of rechargeable cells, terminals for charging the cells and able to be connected to a charger, a bypass circuit associated with each cell, switching elements allowing the connection and disconnection of each cell to and from its associated bypass circuit and control means to control the switching elements, characterized in that to perform the $i^{th}$ charging of the battery with i greater than or equal to two, the connection of the charging terminals to the charger is detected, the detection of the connecting of the charging terminals to the charger triggering, at a first phase, the connection of the cells to their associated bypass circuit for a respective first pre-emptive bypass time associated with cell respectively;

next, for each cell, once the first time has elapsed, at a second associated phase the associated bypass circuit is disconnected from cell until the voltage of the cell reaches a pre-set voltage which is prescribed for the cell and is nonzero;

the first pre-emptive bypass time, respectively associated with cell for the $i^{th}$ charging, having been calculated as a function of the total connection time, during at least one previous charging, of the associated bypass circuit to this cell until all the cells reached the pre-set voltage, at least one time period associated with the cell allowing the determination of:

the first pre-emptive bypass time for the $i^{th}$ charging, and/or said total connection time of the associated bypass circuit to this cell during this at least one previous charging, having been memorised in a memory of the battery during this at least one previous charging.

It will be noted that the first phase may be of zero time length for at least one cell. Also, the memorised period(s) may comprise the first pre-emptive bypass time for example or the total connection period of the bypass circuit to this cell.

According to one embodiment of the invention, for at least one of the cells at the end of the second phase, the associated bypass circuit is connected to the cell so that the voltage of the cell does not exceed a threshold charge voltage during an associated charge maintaining third phase at least up until the voltages of the cells have all reached the pre-set voltage.

According to one embodiment of the invention, a third connection period ($M_{ji}$) of the bypass circuit associated to the cell during the third phase is measured, the first predetermined pre-emptive bypass time associated with the cell for the $i^{th}$ charging taking into account at least the first connection time of the associated bypass circuit to the cell during the first phase of at least one previous charging, and the third connection time of the bypass circuit associated to the cell during the third phase of said at least one previous charging.

According to one embodiment of the invention, each cell is associated with a cell voltage measuring element and with a counter of the third bypass time of the third bypass phase, the measuring element being capable of comparing the measured voltage of the cell with the pre-set voltage and of triggering counting by the counter of the third bypass time when the cell voltage has reached the pre-set voltage.

According to one embodiment of the invention the counters are controlled so as to count, as end of the third bypass time, the instant from which all the cells have reached the pre-set voltage.

According to one embodiment of the invention the first pre-emptive bypass time, respectively associated with the cell for the $i^{th}$ charging, is calculated as a function of the total connection time, during the $i-1^{th}$ charging, of the associated bypass circuit to this cell until all the cells reached the pre-set voltage.

According to one embodiment of the invention the said at least one period of time associated with the cell allowing the determination of:

the first pre-emptive bypass time for the $i^{th}$ charging, and/or the said total connection time of the associated bypass circuit to this cell during the $i-1^{th}$ charging;

was memorised in a memory (21) of the battery during the $i-1^{th}$ charging.

According to one embodiment of the invention during the said at least one previous charging, the period of time associated with the cell that is memorised is at least the first pre-emptive bypass time respectively associated with the cell for the $i^{th}$ charging. The first pre-emptive bypass time for the $i^{th}$ charging was memorised for example in a memory of the battery during the $i-1^{th}$ charging. This period of time was therefore calculated during the $i-1^{th}$ charging.

Other parameters may have been memorised during this charging such as the total bypass connection time of the $i-1^{th}$ charging, or periods allowing determination of this total time (e.g. the total charging time of the battery associated with the duration of the second phase for each cell (j)).

According to one embodiment of the invention during the said at least one previous charging, the period of time associated with the cell that is memorised is at least the said total connection time of the associated bypass circuit to this cell during this at least one previous charging.

According to one embodiment of the invention, the first pre-emptive bypass time $TP_{ji}$ respectively associated with the cell j for the $i^{th}$ charging is calculated as follows:

$$TP_{ji} = TP_{ji-1} + M_{ji-1} - \min_j(TP_{ji-1} + M_{ji-1})$$

where $\min_j (TP_{ji-1} + M_{ji-1})$ designates the minimum of $TP_{ji-1} + M_{ji-1}$ on the cells j.

According to one embodiment of the invention, the first pre-emptive bypass time $TP_{ji}$ respectively associated with the cell j for the $i^{th}$ charging is calculated as follows:

$$TP_{ji} = a \cdot (TP_{ji-1} + M_{ji-1}) - b \cdot \min_j(TP_{ji-1} + M_{ji-1})$$

where $\min_j(TP_{ji-1} + M_{ji-1})$ designates the minimum of $TP_{ji-1} + M_{ji-1}$ on the cells j, and where a, b are prescribed nonzero coefficients.

According to one embodiment of the invention, the coefficients a and b are determined as a function of the charge level of the battery when the connection of the battery to the charger is detected.

In one embodiment, a and b relate to the charge level of the battery when the connection thereof to the charger is detected. These coefficients in particular can be proportional to (1−NCR) where NCR is the charge level remaining in the battery. The coefficients a and b may also be equal.

According to one embodiment, for the first charging of each cell of the battery, the connection of the charging terminals to the charger is detected, the detected connection of the charging terminals to the charger triggering during a second associated phase the disconnection of each cell from its associated bypass circuit to charge the cell until the respective voltage of the cell reaches the pre-set voltage, then for at least one of the cells, at the end of the second associated phase, the associated bypass circuit is connected to the cell so that the voltage of the cell does not exceed the threshold charge voltage during a third associated charge maintaining phase until the voltages of the cells have all reached the pre-set voltage, the first pre-emptive bypass time respectively associated with the cell, and valid for at least the second charging, corresponding to the third connection time of the associated bypass circuit to the cell during the third phase of first charging.

According to one embodiment of the invention, the said pre-set voltage is a voltage lower than or equal to the threshold charge voltage prescribed for the cell and which is nonzero.

According to one embodiment of the invention, the cells are formed by film assembly.

According to one embodiment of the invention, the cells have a nominal operating temperature higher than 20° C.

A further subject of the invention is a battery comprising a plurality of rechargeable cells, terminals for charging the cells and able to be connected to a charger, a bypass circuit associated with each cell, switching elements allowing each cell to be connected and disconnected to and from its associated bypass circuit and control means to control the switching elements, means for measuring the voltage of each cell, characterized in that the control means comprise means to compute a first pre-emptive bypass time respectively associated with the cell for the $i^{th}$ charging where i≥2 as a function of the total connection time, during at least one previous charging, of the associated bypass circuit to this cell until all the cells reached a pre-set voltage, the battery comprising at least one memory to memorise at least one time period associated with the cell and allowing the determination of:

the first pre-emptive bypass time for the $i^{th}$ charging, and/or said total connection time of the bypass circuit to this cell during this at least one previous charging, the battery comprising a detector to detect connection of the charging terminals to the charger, the control means being designed to trigger, for the $i^{th}$ charging of the battery, the connection of the plurality of cells to their associated bypass circuit in response to the fact that the detector has detected that the charging terminals are connected to the charger, and to maintain the connection of each cell to its associated bypass circuit during the first pre-emptive bypass time respectively associated with the cell for the $i^{th}$ charging of the battery, the control means being designed to disconnect, at the end of the first pre-emptive bypass time, the associated bypass circuit from each cell during a second associated phase for the $i^{th}$ charging of the battery until the voltage of the cell reaches the pre-set voltage which is prescribed for the cell (j) and is nonzero.

Figure 2:
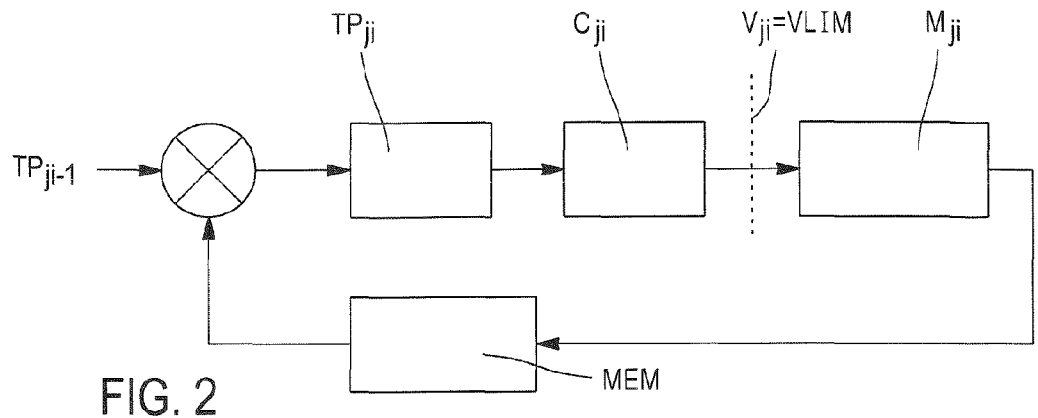
Figure 3:
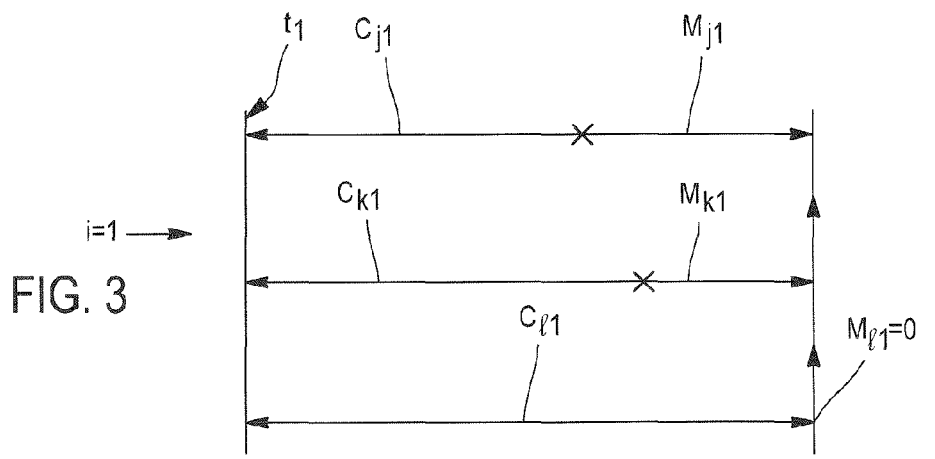
Figure 4:
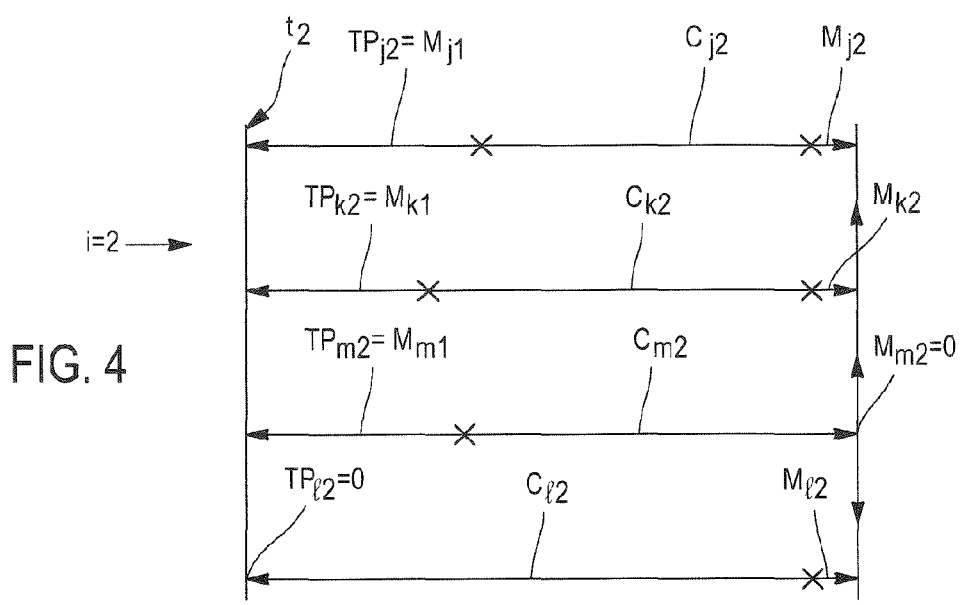
Figure 5:
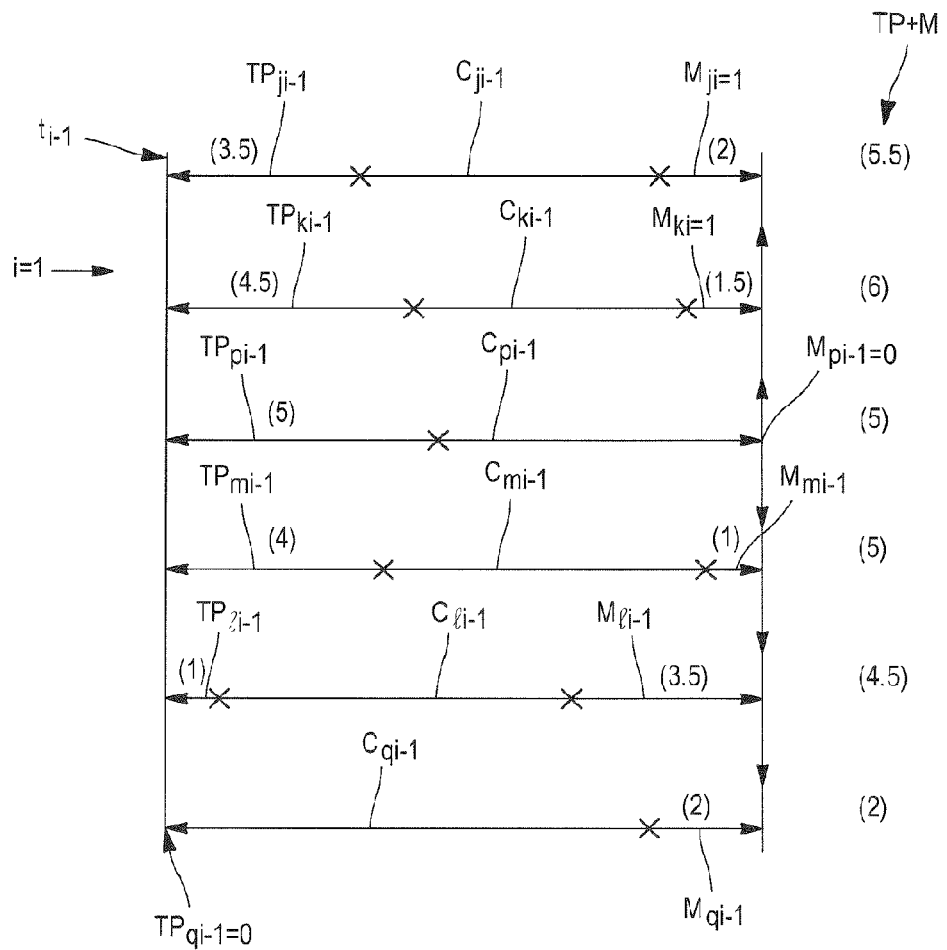
Figure 6:
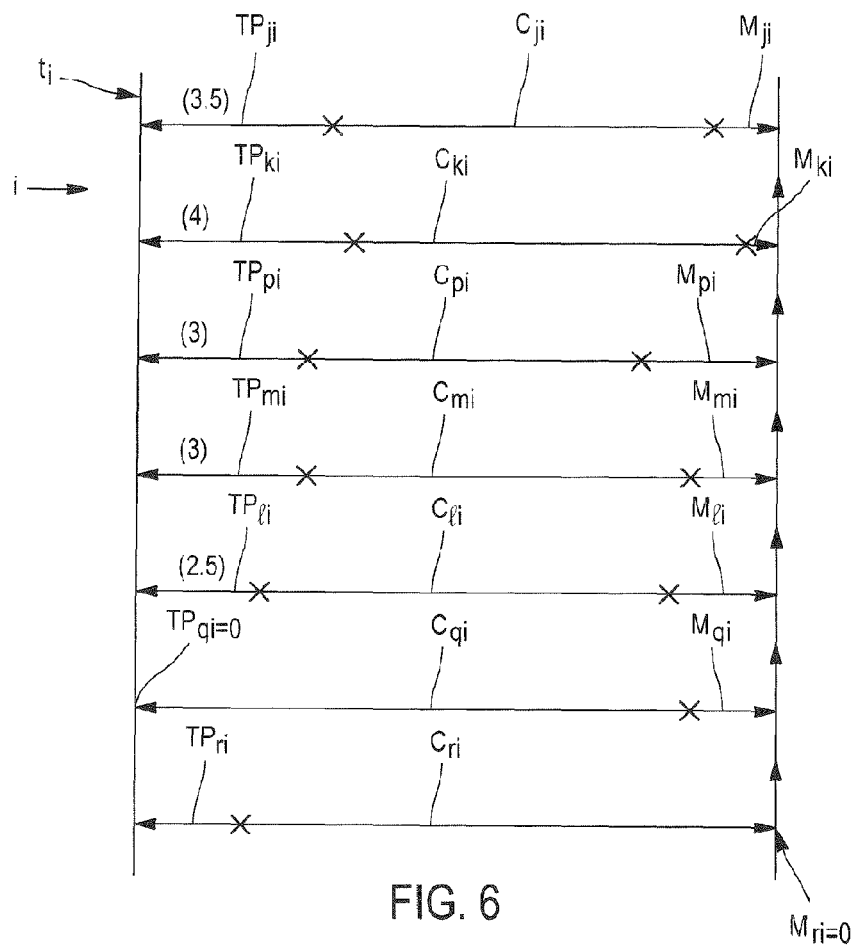
Figure 7:
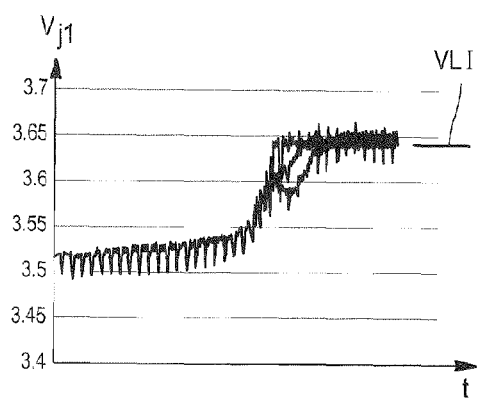
Figure 8:
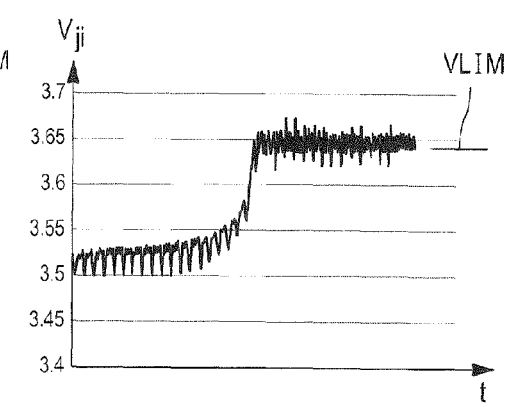

The invention will be better understood on reading the following description given solely as a non-limiting example with reference to the appended drawings in which:

FIG. 1 schematically illustrates one embodiment of a battery according to the invention, FIG. 2 schematically illustrates an example of a flow chart of the charging method of the invention, FIG. 3 schematically illustrates a timing chart of the different operating phases of the different cells of the battery when implementing the charging method of the invention during a first charging of the battery, FIG. 4 schematically illustrates a timing chart of the different operating phases of the different cells of the battery when implementing the charging method of the invention for the second charging of the battery, FIG. 5 schematically illustrates a timing chart of the different operating phases of the different cells of the battery when implementing the charging method of the invention for the i−1$^{th}$ charging of the battery, FIG. 6 schematically illustrates a timing chart of the different operating phases of the different cells of the battery when implementing the charging method of the invention for the i$^{th}$ charging of the battery, FIG. 7 schematically illustrates voltage curves along the Y-axis of the different cells of the battery as a function of time along the X-axis during the first charging, FIG. 8 schematically illustrates voltage curves along the Y-axis of cells of the battery as a function of time along the X-axis during an i$^{th}$ charging.

In the Figures, the electric battery 10 comprises N cells 1, . . . , j, . . . N globally designated by cells j with N being greater than or equal to 2.

In the remainder provision is made for example for cells j, k, l, m, p, q, r with:

$1 \leq j \leq N$,
$1 \leq k \leq N$,
$1 \leq l \leq N$,
$1 \leq m \leq N$,
$1 \leq p \leq N$,
$1 \leq q \leq N$,
$1 \leq r \leq N$, The invention is described below with reference to the embodiment illustrated in the Figures wherein the cells j are formed by an assembly of films for example, e.g. in lithium-metal-polymer. For example, the total thickness of these films is less than 300 micrometers and may be about 150 micrometers for example. The cells have a nominal operating temperature higher than 20° C., e.g. of 90° C. for lithium-metal-polymer technology.

In the description below the cells j are in series. The cells are in series for example and are each rechargeable and dischargeable. The cells may be identical for example.

The battery 10 comprises a control unit 20 controlling its own cells j.

The battery 10 comprises terminals 11, 12 to charge the cells j. The charging terminals 11, 12 are separate from one another. For example provision is made for at least one first charging terminal 11 for charging the cells j and a second charging terminal 12 for charging the cells j. All the cells j are connected for example between the charging terminals 11, 12. The cells j are connected in series for example between the charging terminals 11, 12. The charging terminals 11, 12 are able to be connected to a charger 100 such as an external charger 100 for example. The charger 100 comprises connecting terminals 101, 102 for connection to the charging terminals 11, 12 respectively and a charging member 103 connected between the terminals 101 and 102 to send a charging current thereto to charge the cells j when the terminals 101 and 102 are connected to the terminals 11 and 12 of the battery 10. The fact that a cell is fully charged corresponds to the fact that the voltage between its individual cell terminals is equal in absolute value to a pre-set threshold charge voltage which is a maximum voltage in absolute value for example and is nonzero. The fact that a cell is not fully charged or is partly of fully discharged corresponds to the fact that the voltage between its individual cell terminals is lower in absolute value than the pre-set threshold charge voltage or is zero. The threshold charge voltage is prescribed for the cell j and is nonzero. The individual terminals of each cell are different from the charging terminals 11, 12 of the battery, possibly except for an individual terminal of the first cell 1 connected to the charging terminal 11 and for an individual terminal of the last cell N connected to the charging terminal 12.

The battery may comprise one or more elements for example to heat the cells j to their nominal operating temperature, e.g. in the form of one or more hot plates supplied with electric current by the terminals 11, 12 in particular for cells formed by film assembly e.g. in lithium-metal-polymer.

The battery 10 also comprises a bypass circuit $CPC_j$ associated with each cell j. In addition, the battery 10 comprises switching elements $SW_j$ allowing each cell j to be connected and disconnected to and from its associated bypass circuit $CPC_j$. When the bypass circuit $CPC_j$ is connected to its associated cell j, this bypass circuit $CPC_j$ is connected in parallel with this cell j as illustrated as an example for cell 1 and its associated bypass circuit $CPC_1$ in FIG. 1.

In general, each bypass circuit $CPC_j$ associated with its cell j is electrically in parallel with its associated cell j. In other words, each bypass circuit $CPC_j$ is connected to the individual terminals of the associated cell j in connected position of the associated switching element $SW_j$. Therefore in disconnected position of the bypass circuit $CPC_j$ by the associated switching element $SW_j$, the charge current sent by the charger 100 onto the charging terminals 11, 12 is sent to the cell j for charging or recharging thereof. In connected position of the bypass circuit $CPC_j$ to its associated cell j, the charge current sent by the charger 100 onto the charging terminals 11, 12 partly or fully bypasses the cell j, i.e. at least part of the charge current arriving at the terminals 11, 12 is diverted into the bypass circuit $CPC_j$. The bypass circuit $CPC_j$ comprises one or more electric resistances $R_j$ for example for each cell j.

The switching element $SW_j$ comprises for example a switch $INT_j$ which is closed in connection position and open in disconnection position. The switching element $SW_j$ is placed in series for example with the associated bypass circuit $CPC_j$, wherein this circuit in series comprising this switching element $SW_j$ and this bypass circuit $CPC_j$ is connected in parallel with the associated cell j.

The battery 10 also comprises means 200 to control the switching elements $SW_j$ for the individual controlling of their changeover from the connected position to the disconnected position. Each switching element $SW_j$ comprises for example a control input $E_j$ connected to the unit 20 forming part of the control means 20. The control means 20, 200 are formed for example of an electronic board provided for example with a computer or at least one microprocessor in particular to control the switching elements $SW_j$.

The control means 200 therefore control the respective switching elements $SW_j$ to implement the different phases of the cells which are described below.

According to the invention for each charging of the battery 10 following after the first charging, i.e. for the i$^{th}$ charging where i is greater than or equal to 2, provision is made for a first pre-emptive bypass phase having a pre-emptive bypass time $TP_{ji}$ for cell j respectively, this bypass time $TP_{ji}$ having been calculated as a function of the total connection time of the associated bypass circuit $CPC_j$ to this cell j during at least one previous charging, this total connection time of the bypass circuit $CPC_j$ being the time needed for all the cells j of the battery 10 to reach a pre-set voltage VLIM during this at least one previous charging.

This first pre-emptive bypass time $TP_{ji}$ for the $i^{th}$ charging has been memorised at step MEM in a memory 21 of the battery 10 during this at least one previous charging.

According to one embodiment, the determined voltage VLIM is equal to the threshold charge voltage.

According to one embodiment, the determined voltage VLIM is a voltage lower than or equal to the threshold charge voltage, for example equal to a fixed value which is greater than or equal to 90% of the threshold charge voltage and is lower than or equal to 100% of the threshold charge voltage.

For this $i^{th}$ charging, the first pre-emptive bypass time is followed, for each cell j, by a second associated phase $C_j$ in which the associated bypass circuit $CPC_j$ is disconnected from the cell j until the voltage $V_{ji}$ of the cell j reaches the pre-set voltage VLIM. The cell j is therefore charged during this second phase $C_j$ by the charger 100 connected to the terminals 11, 12. The predetermined voltage VLIM is prescribed for the cell j and is nonzero.

The different phases occurring during the $i^{th}$ charging are described in more detail below with reference to FIGS. 5 and 6 given as illustrative examples.

First a description is given below of the steps occurring during the first charging of the battery 10 with reference to FIG. 3 given as an illustrative example.

The term "associated" means the parts associated with a cell j and carries the same subscript j or the same other subscript as this associated cell.

First Charging i=1

At the first charging for example at time $t_1$ the connection of the charging terminals 11, 12 to the charger 100 is detected. The detecting of the connection of the charging terminals 11, 12 to the charger 100 triggers the disconnection of each cell j, during a second associated phase $C_{j1}$, from its associated bypass circuit $CPC_j$ to charge the cell j until the respective voltage $V_{j1}$ of the cell j reaches the pre-set voltage VLIM.

For example for each cell j, provision is made for a measuring element $MES_j$ to measure the voltage of the cell j. The voltage $V_{ji}$ measured by the element $MES_j$ of the cell j is sent to the control means 200.

Then, for at least one of the cells j at the end of the second associated phase $C_{j1}$, i.e. when this cell j has reached the pre-set voltage VLIM, the associated bypass circuit $CPC_j$ is connected to the cell j to maintain the voltage $V_{j1}$ of the cell j at the pre-set voltage VLIM during an associated charge maintaining third phase $M_{j1}$ until the voltages $V_{j1}$, $V_{k1}$, $V_{l1}$ of all the cells j, k, l (and others) do not exceed the threshold charge voltage.

As can be seen in FIG. 3, for cell j at the time of first charging (i=1) and as soon as connection of the battery to the charger is detected, provision is therefore made for implementation of the second phase $C_{j1}$ to disconnect cell j from its associated bypass circuit $CPC_j$, followed by the charge maintaining third phase $M_{j1}$, which lasts a third charge maintaining time $M_{j1}$.

Provision is therefore made for cell k at the time of first charging (i=1) and as soon as connection of the battery to the charger is detected, for implementation of the second phase $C_{k1}$ to disconnect cell k from its associated bypass circuit $CPC_k$, followed by the third charge maintaining phase $M_{k1}$ which lasts a charge maintaining time $M_{k1}$.

Provision is made for cell l at the time of first charging (i=1) and as soon as connection of the battery to the charger is detected, for implementation of the second phase $C_{l1}$ to disconnect cell l from its associated bypass circuit $CPC_l$ to charge cell l until the respective voltage $V_{l1}$ of cell l reaches the pre-set voltage VLIM. This is followed by the charge maintaining third phase $M_{l1}$ which lasts a zero length of time, since cell l is for example the cell taking the longest time to charge and hence taking the longest time for its voltage $V_{l1}$ to reach the pre-set voltage VLIM. This amounts to saying that cell l has no associated charge maintaining phase $M_{l1}$ or has an associated charge maintaining phase $M_{l1}$ lasting a third charge maintaining time $M_{l1}$ equal to zero. As can be seen in FIG. 3, the end of the second phase $C_{l1}$ of cell l which is the longest of all the cells, causes the end of the charge maintaining third phases $M_{j1}$, $M_{k1}$ of the other cells j, k.

At step MEM during this first charging i=1, the third connection time $M_{j1}$ of the associated bypass circuit $CPC_j$ to the cell j during the third phase $M_{j1}$ of the first charging, i.e. $TP_{j2}=Mj1$, is memorised in memory 21 of the battery 10 as first pre-emptive bypass time $TP_{j2}$ respectively associated with cell j.

Similarly, for the other cells e.g. for cell k during this first charging i=1, the third connection time $M_{k1}$ of the associated bypass circuit $CPC_k$ to cell k during the third phase $M_{k1}$ of the first charging, i.e. $TP_{k2}=Mk1$, is memorised in memory 21 of the battery 10 as first pre-emptive bypass time $TP_{k2}$ respectively associated with cell k.

For cell l the memorised time $TP_{l2}$ is zero.

Second Charging i=2

During the second charging i=2 and at time $t_2$ for example, the connection of the charging terminals 11, 12 to the charger 100 is detected as is shown by way of illustration in FIG. 4.

The connection of the charging terminals 11, 12 to the charger 100, once detected, triggers the connection of cells j, k, m to their associated bypass circuit $CPC_j$, $CPC_k$, $CPC_m$ respectively for a first pre-emptive bypass time $TP_{j2}=M_{j1}$, $TP_{k2}=M_{k1}$, $TP_{m2}=M_{m1}$ associated with cell j, k and m. These first pre-emptive bypass times $TP_{j2}$, $TP_{k2}$, $TP_{m2}$ respectively associated with cells j, k, m for the second charging, have been calculated as a function of the total connection time of the associated bypass circuits $CPC_j$ $CPC_k$, $CPC_m$ to these cells j, k, m, the said total connection time having been determined during the first previous charging (i=1) and was the time required for all the cells j, k, m to reach the pre-set voltage VLIM. This first pre-emptive bypass time $TP_{j2}$, $TP_{k2}$, $TP_{m2}$ for the second charging was memorised in the memory 21 of the battery 10 during this first previous charging at step MEM. The same applies to all the cells except for the at least one cell l for which the first pre-emptive bypass time $TP_{l2}=0$ and for which the second phase $C_{l2}$ is performed immediately after the initial starting time $t_2$ of the second charging i=2.

Thereafter, for each cell j, k, m, l, i.e. for all the cells, the second associated phase $C_{j2}$, $C_{k2}$, $C_{m2}$, $C_{l2}$ is performed, in which the associated bypass circuit $CPC_j$, $CPC_k$, $CPC_m$, $CPC_l$ is disconnected from cells j, k, m, l until the voltage $V_{j2}$, $V_{k2}$, $V_{m2}$, $V_{l2}$ of cells j, k, m, l reaches the pre-set voltage VLIM. During this second phase $C_{j2}$, $C_{k2}$, $C_{m2}$, $C_{l2}$, the corresponding cell j, k, l, m is recharged up to the pre-set voltage VLIM by the charge current sent onto the terminals 11, 12 by the charger 100.

It is therefore possible that all the second associated phases $C_{j2}$, $C_{k2}$, $C_{m2}$, $C_{l2}$ terminate exactly at the same time. This is the ideal case. In this case, it would not be necessary to perform the third charge maintaining phase after the second phase for the cells However, in practice the second phases $C_{j2}$, $C_{k2}$, $C_{m2}$, $C_{l2}$ may not terminate at the same time i.e. the second phase $C_{m2}$ may finish last for cell m compared with the other cells. In this case, for all the cells other than cell(s) m of which the second associated phase $C_{m2}$ finishes last, provision is made for a third charge maintaining phase $M_{j2}$, $M_{k2}$, $M_{l2}$ respectively for cells j, k, l. This amounts to causing the second phase $C_{m2}$ of cell m to be followed by a third associated phase $M_{m2}=0$ i.e. lasting a third charge maintaining time $M_{m2}$ of zero duration.

The control means 20 are part of a control unit 200 for controlling the battery 10. This control unit 200 for controlling the battery, in addition to elements $MES_j$ for measuring the voltage $V_{ji}$ of the cells j, comprises a clock H and a counter $CT_j$ respectively associated with each cell j.

According to one embodiment, each cell j is associated with a voltmeter $MES_j$ to measure the voltage $V_{ji}$ of cell j, and with a counter $CT_j$ to count the third bypass time $M_{ji}$ of the third bypass phase $M_{ji}$, the measuring element $MES_j$ being capable of comparing the measured voltage $V_{ji}$ of cell j with the pre-set voltage VLIM and of triggering the counter $CT_j$ so that, it counts as third bypass time $M_{ji}$ the time from which the voltage $V_{ji}$ of the cell j has reached the pre-set voltage VLIM. Each counter counts the time elapsed since the moment it was triggered by the signal received from the measuring element, namely when the voltage $V_{ji}$ of the cell j reached the pre-set voltage VLIM. The last cell m reaching this pre-set voltage VLIM during the second phase $C_{m2}$ triggers the stopping of the counters $CT_j$, $CT_k$, $CT_l$ of the other cells j, k, l, the said counters then giving the third charge maintaining periods $M_{j2}$, $M_{k2}$, $M_{l2}$ thus counted, which are then memorised in the memory 21 at step MEM.

Similarly, in association with cells k, l, m, p, q, r respectively, provision is made for measuring members $MES_k$, $MES_l$, $MES_m$, $MES_p$, $MES_q$, $MES_r$ to measure their respective voltages $V_{ki}$, $V_{li}$, $V_{mi}$, $V_{pi}$, $V_{qi}$, $V_{ri}$ for respective counters $CT_k$, $CT_l$, $CT_m$, $CT_p$, $CT_q$, $CT_r$ of the time elapsed since the respective associated cell k, l, m, p, q, r reached the pre-set voltage VLIM, and for associated bypass circuits $CPC_k$, $CPC_l$, $CPC_m$, $CPC_p$, $CPC_q$, $CPC_r$, associated switching elements $SW_k$, $SW_l$, $SW_m$, $SW_p$, $SW_q$, $SW_r$, associated switches $INT_k$, $INT_l$, $INT_m$, $INT_p$, $INT_q$, $INT_r$, and associated control inputs $E_k$, $E_l$, $E_m$, $E_p$, $E_q$, $E_r$.

Charging i−1 (i≥2)

In FIG. 5, for the i−$1^{th}$ charging, for cell j, the connection of the charging terminals 11, 12 to the charger 100 is detected at time $t_{i-1}$. This connection of the charging terminals to the charger 100 once detected triggers the connection of cell j to its associated bypass circuit $CPC_j$ during the first pre-emptive bypass time $TP_{ji-1}$ associated with cell j. Next, during the second phase $C_{ji-1}$ associated with cell j, the associated bypass circuit $CPC_j$ is disconnected from cell j until the voltage $V_{ji-1}$ of cell j reaches the pre-set voltage VLIM for charging of cell j. At the end of the second phase $C_{ji-1}$ the bypass circuit $CPC_j$ is connected to the associated cell j so that the voltage $V_{ji-1}$ of cell j does not exceed the threshold charge voltage during the associated charge maintaining third phase $M_{ji-1}$ at least until the voltages of all the cells reach the pre-set voltage VLIM.

Similarly, provisions is made, respectively for cells k, m and l, for the first pre-emptive bypass time $TP_{ki-1}$, $TP_{mi-1}$, $TP_{li-1}$, then the second associated phase $C_{ki-1}$, $C_{mi-1}$, $Cl_{i-1}$ to charge the cells k, m, l up to the pre-set voltage VLIM, and then the third charge maintaining phase having the third connection time $M_{ki-1}$, $M_{mi-1}$, $M_{li-1}$ of the associated bypass circuit $CPC_k$, $CPC_m$, $CPC_l$ to the respective cells k, m, l.

It is assumed, during charging i−1, that cell q has a first time $TP_{qi-1}=0$ since it was previously the last to reach the pre-set voltage VLIM, and that therefore the connection of the charging terminals 11, 12 to the charger 100, for cell q at the initial time $t_{i-1}$, triggers the associated second phase $C_{qi-1}$ when the associated bypass circuit $CPC_q$ is disconnected from cell q to charge this cell q until the voltage $V_{qi-1}$ of cell q reaches the pre-set voltage VLIM. Then at the end of this second phase $C_{qi-1}$, the associated bypass circuit $CPC_q$ is connected to cell q to maintain the voltage $V_{qi-1}$ of cell q at the pre-set voltage VLIM during the third associated charge maintaining phase $M_{qi-1}$. Evidently cell q may differ from cells j, k, m and l or it may be one of these cells j, k, m, l.

Similarly cell p has the first pre-emptive bypass time $TP_{pi-1}$ but it is assumed that it is this cell p which last reaches the pre-set voltage VLIM when charging this cell p during the second associated phase $C_{pi-1}$ in which the associated bypass circuit $CPC_p$ is disconnected from cell p until the voltage $V_{pi-1}$ of cell p reaches the pre-set voltage VLIM. As a result, for this cell p there is no charge maintaining third phase $M_{pi-1}$ or there is a charge maintaining third phase lasting a third charge maintaining time $M_{pi-1}$ equal to zero as illustrated in FIG. 5. This stops the third charge maintaining phase $M_{ji-1}$, $M_{ki-1}$, $M_{li-1}$, $M_{mi-1}$, $M_{qi-1}$, of the other cells j, k, l, m, q. The charger 100 can then be disconnected from the charging terminals 11, 12. Evidently, a charge maintaining third phase $M_{pi-1}$ lasting a nonzero charge maintaining third time $M_{pi-1}$ could be envisaged, which would lengthen the charge maintaining third phases of the other cells accordingly.

In one embodiment, provision is made for example for a limit duration of each charge maintaining third phase so that the third charge maintaining phase is automatically stopped beyond this limit.

In one embodiment, the fact that the voltage $V_{ji-1}$, $V_{ki-1}$, $V_{li-1}$, $V_{mi-1}$, $V_{pi-1}$, $V_{qi-1}$, $V_{ri-1}$ of cell j, k, l, m, P, q, r reaches the pre-set voltage VLIM is detected by the associated voltage measuring member $MES_j$, $MES_k$, $MES_l$, $MES_m$, $MES_p$, $MES_q$, $MES_r$ which compares the measured voltage with this pre-set voltage VLIM.

According to one embodiment, the third connection period $M_{ji-1}$, $M_{ki-1}$, $M_{li-1}$, $M_{mi-1}$, $M_{pi-1}$, $M_{qi-1}$, $M_{ri-1}$ of the bypass circuit $CPC_j$, $CPC_k$, $CPC_l$, $CPC_m$, $CPC_p$, $CPC_q$, $CPC_r$ associated with the cell j, k, l, m, p, q, r during the charge maintaining third phase $M_{ji-1}$, $M_{ki-1}$, $M_{li-1}$, $M_{mi-1}$, $M_{pi-1}$, $M_{qi-1}$, $M_{ri-1}$ is measured, for example by means of the counter $CT_j$, $CT_k$, $CT_l$, $CT_m$, $CT_p$, $CT_q$, $CT_r$ and the clock H.

Charging i (i≥2)

At the time of charging i, at time $t_i$ for example, the connection of the charging terminals 11, 12 to the charger 100 is detected as shown in the illustrative example shown in FIG. 6.

The connection of the charging terminals 11, 12 to the charger 100 once detected triggers the connection of cells j, k, l, m, p, r to their associated bypass circuit $CPC_j$, $CPC_k$, $CPC_l$, $CPC_m$, $CPC_p$, $CPC_r$ for a respective first pre-emptive bypass time $TP_{ji}$, $TP_{ki}$, $TP_{li}$, $TP_{mi}$, $TP_{pi}$, $TP_{ri}$ associated with the cells j, k, l, m, p, r. These first pre-emptive bypass times $TP_{ji}$, $TP_{ki}$, $TP_{li}$, $TP_{mi}$, $TP_{pi}$, $TP_{ri}$ respectively associated with cells j, k, l, m, p, r for charging i have been calculated as a function of the total connection time of the associated bypass circuits $CPC_j$, $CPC_k$, $CPC_l$, $CPC_m$, $CPC_p$, $CPC_r$ to these cells j, k, l, m, p, r, the said total connection time having been determined during at least one previous charging, for example the previous charging i−1, and was the time needed for all the cells j, k, l, m, p, r to reach the pre-set voltage VLIM during this at least one previous charging e.g. the previous charging i−1. This first pre-emptive bypass time $TP_{ji}$, $TP_{ki}$, $TP_{li}$, $TP_{mi}$, $TP_{pi}$, $TP_{ri}$ for charging i has been memorised in the memory 21 of the battery 10 at step MEM during this at least one previous charging e.g. previous charging i−1. The same applies to all the cells except for the at least one cell q for which the first pre-emptive bypass time $TP_{qi}=0$ and for which the second phase $C_{qi}$ is performed immediately after the initial start time $t_i$ of charging i to charge the cell q up to the pre-set voltage VLIM. In another embodiment, the total connection time of the bypass circuit $CPC_j$, $CPC_k$, $CPC_l$, $CPC_m$, $CPC_p$, $CPC_r$ to the associated cell j, k, l, m, p, r during this at least one previous charging, e.g. charging i−1, allowing calculation of the first bypass time for charging i was memorised in the memory 21 of the battery. In another embodiment, the first pre-emptive bypass time $TP_{ji}$, $TP_{ki}$, $TP_{li}$, $TP_{mi}$, $TP_{pi}$, $TP_{ri}$ for the $i^{th}$ charging and/or the said total connection time of the bypass circuit $CPC_j$, $CPC_k$, $CPC_l$, $CPC_m$, $CPC_p$, $CPC_r$ to the associated cell j, k, l, m, p, r during this at least one previous charging, e.g. charging i−1, allowing calculation of the first bypass time for charging i was memorised in the memory 21 of the battery during this at least one previous charging, e.g. charging i−1.

Next, for each cell j, k, l, m, p, q, r, i.e. for all the cells, the second associated phase $C_{ji}$, $C_{ki}$, $C_{li}$, $C_{mi}$, $C_{pi}$, $C_{qi}$, $C_{ri}$ is performed, in which the associated bypass circuit $CPC_j$, $CPC_k$, $CPC_l$, $CPC_m$, $CPC_p$, $CPC_q$, $CPC_r$ is disconnected from the cell j, k, l, m, p, q, r, until the voltage $V_{ji}$, $V_{ki}$, $V_{li}$, $V_{mi}$, $V_{pi}$, $V_{qi}$, $V_{ri}$ of the cell j, k, l, m, p, q r, reaches the pre-set voltage VLIM. During this second phase $C_{ji}$, $C_{ki}$, $C_{li}$, $C_{mi}$, $C_{pi}$, $C_{qi}$, $C_{ri}$ the corresponding cell j, k, l, m, p, q, r is recharged up to the pre-set voltage VLIM by the charging current which is sent onto the terminals 11, 12 by the charger 100.

It is therefore possible that all the associated second phases $C_{ji}$, $C_{ki}$, $C_{li}$, $C_{mi}$, $C_{pi}$, $C_{qi}$, $C_{ri}$ terminate exactly at the same time in the ideal case. In this case, it is not necessary to perform the charge maintaining third phase for the cells after the second phase. However, in practice the second phases $C_{ji}$, $C_{ki}$, $C_{mi}$, $C_{li}$, may not all terminate at the same time i.e. the second phase $C_{ri}$ may terminate last for cell r relative to the other cells j, k, l, m, p, q. In this case, for all the cells other than the cell(s) r of which the second associated phase $C_{ri}$ terminates last, a charge maintaining third phase is provided lasting a charge maintaining third time $M_{ji}$, $M_{ki}$, $M_{li}$, $M_{mi}$, $M_{pi}$, $M_{qi}$ for the cells j, k, l, m, p, q respectively. This amounts to having the second phase $C_{ri}$ of cell r followed by a third associated phase $M_{ri}=0$ i.e. lasting a charge maintaining third time $M_{ri}$ that is zero. In the illustrated embodiment, the end of the second phase $C_{ri}$ e.g. triggered by the fact that the at least one cell r is the last to reach the pre-set voltage VLIM during the connection of its bypass circuit $CPC_r$ or by the fact that the third associated charge maintaining phase $M_{ri}$ of this at least one cell r is of zero duration, triggers the end of the third duration $M_{ji}$, $M_{ki}$, $M_{li}$, $M_{mi}$, $M_{pi}$, $M_{qi}$ of the charge maintaining third phase of the other cells j, k, l, m, p, q. The charger 100 can then be disconnected from the charging terminals 11, 12. Evidently a charge maintaining third phase $M_{ri}$ having a nonzero charge maintaining third duration $M_{ri}$ could be provided, which would prolong the third phases of the other cells accordingly. Evidently the cell r may differ from cell j, k, m, l, p or it may be one of these cells j, k, m, l, p.

In one embodiment, the fact that the voltage $V_{ji}$, $V_{ki}$, $V_{li}$, $V_{mi}$, $V_{pi}$, $V_{qi}$, $V_{ri}$ of cell j, k, l, m, p, q, r has reached the pre-set voltage VLIM is detected by the associated voltage measuring member $MES_j$, $MES_k$, $MES_l$, $MES_m$, $MES_p$, $MES_q$, $MES_r$ by comparing the measured voltage $V_{ji}$, $V_{ki}$, $V_{mi}$, $V_{pi}$, $V_{qi}$, $V_{ri}$ with this pre-set voltage VLIM.

According to one embodiment, the third duration $M_{ji}$, $M_{ki}$, $M_{li}$, $M_{mi}$, $M_{pi}$, $M_{qi}$, $M_{ri}$ of the connection of the bypass circuit $CPC_j$, $CPC_k$, $CPC_l$, $CPC_m$, $CPC_p$, $CPC_q$, $CPC_r$ associated with cell j, k, l, m, p, q, r, during the charge maintaining third phase $M_{ji}$, $M_{ki}$, $M_{li}$, $M_{mi}$, $M_{pi}$, $M_{qi}$, $M_{ri}$, is measured, for example using the counter $CT_j$, $CT_k$, $CT_l$, $CT_m$, $CT_p$, $CT_q$, $CT_r$ and clock H.

According to one embodiment, the first predetermined pre-emptive bypass time $TP_{ji}$, $TP_{ki}$, $TP_{li}$, $TP_{mi}$, $TP_{pi}$, $TP_{ri}$ associated with cell j, k, l, m, p, r for the $i^{th}$ charging takes into account at least the second connection time $TP_{ji-1}$, $TP_{ki-1}$, $TP_{li-1}$, $TP_{mi-1}$, $TP_{pi-1}$, $TP_{ri-1}$ of the bypass circuit $CPC_j$, $CPC_k$, $CPC_l$, $CPC_m$, $CPC_p$, $CPC_r$ associated with cell j, k, l, m, p, r during the first phase of at least one previous charging e.g. charging i−1, and the third connection time $M_{ji}$, $M_{ki}$, $M_{li}$, $M_{mi}$, $M_{pi}$, $M_{ri}$ of the bypass circuit $CPC_j$ associated with cell j, k, l, m, p, r during the charge maintaining third phase of this at least one previous charging, e.g. charging i−1.

According to one embodiment, the first pre-emptive bypass time $TP_{ji}$, $TP_{ki}$, $TP_{li}$, $TP_{mi}$, $TP_{pi}$, $TP_{ri}$ respectively associated with cell j, k, l, m, p, r for the $i^{th}$ charging is calculated as a function of at least the total connection time of the associated bypass circuit $CPC_j$, $CPC_k$, $CPC_l$, $CPC_m$, $CPC_p$, $CPC_r$ to this cell j, k, l, m, p, r which was determined during the $(i-1)^{th}$ charging and which was needed for all the cells to reach the pre-set voltage VLIM, the first pre-emptive bypass time $TP_{ji}$, $TP_{ki}$, $TP_{li}$, $TP_{mi}$, $TP_{pi}$, $TP_{ri}$ for the $i^{th}$ charging having been memorised in a memory of the battery during this i−$1^{th}$ charging.

In one embodiment, the first pre-emptive bypass time $TP_{ji}$ respectively associated with cell j for the $i^{th}$ charging is calculated as follows:

$$TP_{ji}=TP_{ji-1}+M_{ji-1}-\min_j(TP_{ji-1}+M_{ji-1})$$

where $\min_j (TP_{ji-1}+M_{ji-1})$ designates the minimum of $TP_{ji-1}+M_{ji-1}$ on cells j.

Similarly for the other cells k, l, m, p, q, r respectively:

$$TP_{ki}=TP_{ki-1}+M_{ki-1}-\min_j(TP_{ji-1}+M_{ji-1}),$$

$$TP_{li}=TP_{li-1}+M_{li-1}-\min_j(TP_{ji-1}+M_{ji-1})$$

$$TP_{mi}=TP_{mi-1}+M_{mi-1}-\min_j(TP_{ji-1}+M_{ji-1})$$

$$TP_{pi}=TP_{pi-1}+M_{pi-1}-\min_j(TP_{ji-1}+M_{ji-1})$$

$$TP_{qi}=TP_{qi-1}+M_{qi-1}-\min_j(TP_{ji-1}+M_{ji-1})=0$$

$$TP_{ri}=TP_{ri-1}+M_{ri-1}-\min_j(TP_{ji-1}+M_{ji-1}).$$

The control means 200 comprise means 20 for computing the first pre-emptive bypass time $TP_{ji}$ respectively associated with cell j for the $i^{th}$ charging where i≥2 as a function of the total connection time of the associated bypass circuit $CPC_j$ to this cell j which was determined during at least one previous charging and is needed for all the cells to reach the predetermined voltage VLIM.

The battery comprises at least the memory 21 to memorise the first pre-emptive bypass time $TP_{ji}$ for the $i^{th}$ charging and/or the said total connection time of the bypass circuit $CPC_j$ to this cell j during this at least one previous charging.

The battery comprises a detector to detect connection of the charging terminals 11, 12 to the charger 100. For this purpose for example the presence of a charging socket is detected on the terminals 11, 12, wherein this charging socket is intended to connect the terminals 11, 12 of the battery to the terminals 101, 102 of the charger 100 and/or the closing of a panel which has to be closed to carry out charging is detected and/or the actuation of a mechanical member which must be actuated to carry out charging is detected and/or the receiving of status frames originating from the charger via a communication bus of the battery is detected.

The control means 200, for the $i^{th}$ charging of the battery, are designed to trigger the connection of the plurality of cells to their associated bypass circuit $CPC_j$ in response to the fact that the detector has detected that the charging terminals are connected to the charger, and to maintain the connection of each cell j to its associated bypass circuit $CPC_j$ during the first pre-emptive bypass time $TP_{ji}$ respectively associated with cell j for the $i^{th}$ charging of the battery.

The control means 200, at the end of the first pre-emptive bypass time $TP_{ji}$, are designed to disconnect the bypass circuit $CPC_j$ associated with each cell j during a second associated phase $C_{ji}$ for the $i^{th}$ charging of the battery until the voltage $V_{ji}$ of the cell j reaches the pre-set voltage VLIM.

FIGS. 5 and 6, as illustrative numerical examples, indicate between brackets the numerical values of these first and third periods of time and the sum thereof TP+M for the i-1 charging, and the corresponding numerical values calculated for the first pre-emptive bypass time during the i charging of cells j, k, l, m, p, q, r.

The invention avoids having to supply electric energy to cells which have already reached the pre-set voltage VLIM, thereby preventing degradation of their properties and in particular preventing acceleration of their ageing. Therefore, with the invention it is possible to cause the second charging phase $C_{ji}$ of the cells to terminate at close times, or it is possible to arrive at practically the same termination time of this second phase $C_{ji}$ for all the cells j. The duration $M_{ji}$ of the charge maintaining third phase of the cells j is also reduced which also prevents degradation of cell properties.

Additionally the method of the invention is self-adaptive. It adapts to fluctuations in operation of the cells, in particular fluctuations in charging time of the cells until they reach their pre-set voltage VLIM. It is therefore possible after a few charging operations, even practically after only two charging operations, to arrive at second charging phases which practically all terminate at the same time, and hence it is possible to obtain very short charge maintaining third phases.

Also, by causing each charging to start with the first pre-emptive bypass phase of practically all the cells, it is possible to perform this bypassing when the cells are not charged up to their pre-set voltage VLIM which prevents too much demand being placed thereupon.

The reducing of the charge maintaining third phases of the cells avoids charging/discharging microcycles which generally occur during charge maintaining phases, and therefore limits ageing of the cells without however increasing the charging time of the battery 10.

In addition, since the current sent to the bypass circuits $CPC_j$ is lower during the first bypass phase which takes place at the start of charging, less heat is dissipated via Joule effect on account of the connection of this bypass circuit. This prevents perturbed functioning of the battery cells since it avoids the adding to the battery heating elements of any additional non-controlled heating generated by the bypass circuit. Therefore less energy is used to charge the battery.

In one embodiment, to avoid additional charging and discharging microcycles it is possible for example to disconnect the charger 100 from the charging terminals 11, 12 of the battery 10 once the battery is considered to be charged, only the heating elements intended to hold the battery 10 at an adapted temperature remaining connected to the charger. This also provides for less energy consumption.

In the foregoing the pre-set voltage VLIM is the voltage at which the bypass circuit is again connected. Here the pre-set voltage VLIM corresponds for example also to the voltage at which it is considered that the elementary cell j is charged (threshold charge voltage) but it could differ from the threshold charge voltage. This pre-set voltage VLIM is a maximum prescribed charge voltage for the cell j for example. The pre-set voltage VLIM may be identical for all the cells j for example, or it may differ from one cell to another. The threshold charge voltage may be identical for all the cells j for example or it may differ from one cell to another.

In one embodiment, the pre-set voltage VLIM can be parameterised.

In one embodiment the threshold charge voltage can be parameterised. For example, the pre-set voltage VLIM is previously recorded in the memory 21.

For example, the threshold charge voltage is previously recorded in the memory 21.

In the embodiments in which the charge maintaining third phase $M_{ji}$ is provided, this third phase allows correction of the time period $TP_{ji+1}$ for the next charging i+1.

In other embodiments, the first pre-emptive bypass time $TP_{ji}$ may take into account several first phases $TP_j$ and several third phases $M_j$ of several previous charging operations, for example by taking into account the mean time values of these first and third phases.

The method may also comprise a single measuring step indicated above during the first charging operation, the other charging operations being performed on the basis of the data measured during this measuring step (e.g. the first). The different time periods could also be determined using different cell-related theoretical values. However these embodiments are not preferred embodiments since they do not take into consideration the changes undergone by the cells throughout their lifetime.

It can be seen in FIG. 7 that during the first charging the cells do not all reach the pre-set voltage VLIM at the same time, and therefore have charge maintaining third phases which do not start at the same time, since the voltage curves of the cells shown in this Figure are not superimposed.

In FIG. 8 it can be seen that for the $i^{th}$ charging the voltage curves are almost superimposed and much more than in FIG. 7, that the cells reach their pre-set voltage VLIM almost at the same time and therefore have charge maintaining third phases also starting almost at the same time. This proves the efficacy of the system.

In another embodiment, the first pre-emptive bypass time $TP_{ji}$ respectively associated with cell j for the $i^{th}$ charging is calculated as follows:

$$TP_{ji}=a\cdot(TP_{ji-1}+M_{ji-1})-b\cdot\min_j(TP_{ji-1}+M_{ji-1})$$

where $\min_j(TP_{ji-1}+M_{ji-1})$ designates the minimum $TP_{ji-1}+M_{ji-1}$ on the cells j and where a and b are prescribed nonzero coefficients. These coefficients relate for example to the charge level of the battery at the time of its connection to the charger.

The invention claimed is:

1. A method for charging a battery having respective cells, wherein the method comprises, to perform an $i^{th}$ charging of the battery with i greater than or equal to two,
memorizing in a memory of the battery during at least one charging previous to the $i^{th}$ charging at least one respective time period associated with each respective cell and representative of a respective first pre-emptive bypass time of a respective bypass circuit to the respective cell for the $i^{th}$ charging and/or of a respective total connection time of the respective bypass circuit to the respective cell for the at least one charging previous to the $i^{th}$ charging until all the respective cells reached a pre-set voltage, which is prescribed for the respective cell and is nonzero, calculating the respective first pre-emptive bypass times associated with the respective cells for the $i^{th}$ charging, based on the at least one respective time period, detecting connection of charging terminals of the battery to a charger for the $i^{th}$ charging, to trigger at a respective first phase, connection of the respective cells to their respective bypass circuit for the respective first pre-emptive bypass time;

next, for each respective cell, once the respective first pre-emptive bypass time has elapsed, disconnecting at a respective second phase the respective bypass circuit from the respective cell until a voltage of the respective cell reaches the pre-set voltage.

2. The method according to claim 1, further comprising for at least one of the respective cells and for the $i^{th}$ charging, at the end of the respective second phase, the respective bypass circuit to the respective cell so that the voltage of the respective cell does not exceed a threshold charge voltage during a respective charge maintaining third phase and at least until the voltages of the respective cells have all reached the pre-set voltage.

3. The method according to claim 2, further comprising measuring a respective third connection time of the respective bypass circuit to the respective cell during the respective charge maintaining third phase, wherein said calculating of the respective first pre-emptive bypass time associated with the respective cell for the $i^{th}$ charging at least takes into account a respective first connection time of the respective bypass circuit to the respective cell during the respective first phase of the at least one charging previous to the $i^{th}$ charging and the respective third connection time during the respective charge maintaining third phase of the at least one charging previous to the $i^{th}$ charging.

4. The method according claim 3, further comprising measuring the voltage of the respective cell and comparing the voltage of the respective cell with the pre-set voltage, wherein the respective third connection time corresponds to the voltage of the respective cell having reached the pre-set voltage.

5. The method according to claim 4, wherein the respective third connection time ends at an instant from which all the cells respective have reached the pre-set voltage.

6. The method according to claim 1, wherein the calculating of the respective first pre-emptive bypass time is done as a function of the respective total connection time, during an $i-1^{th}$ charging, of the respective bypass circuit to the respective cell until all the respective cells reached the pre-set voltage.

7. The method according to claim 1, wherein the memorizing of the at least one time period is done during an $i-1^{th}$ charging.

8. The method according to claim 1, wherein the memorizing comprises memorizing of the respective first pre-emptive bypass time of the respective bypass circuit associated with the respective cell for the $i^{th}$ charging.

9. The method according to claim 1, wherein the memorizing comprises memorizing of the respective total connection time of the respective bypass circuit to the respective cell for the at least one charging previous to the $i^{th}$ charging.

10. The method according to claim 9, wherein:
the calculating of the respective first pre-emptive bypass time $TP_{ij}$ associated with the respective cell j for the $i^{th}$ charging is done as follows:

$$TP_{ij}=TP_{ji-1}+M_{ji-1}-\min_j(TP_{ji-1}+M_{ji-1})$$

where $\min_j(TP_{ji-1}+M_{ji-1})$ designates the minimum of $TP_{ji-1}+M_{ji-1}$ on the respective cells j.

11. The method according to claim 9, wherein the calculating of
the respective first pre-emptive bypass time $TP_{ji}$ associated with the respective cell j for the $i^{th}$ charging is done as follows:

$$TP_{ji}=a \cdot (TP_{ji-1}+M_{ji-1})-b \cdot \min_j(TP_{ji-1}+M_{ji-1})$$

where $\min_j(TP_{ji-1}+M_{ji-1})$ designates the minimum of $TP_{ji-1}+M_{ji-1}$ on the respective cells, and where a, b are prescribed nonzero coefficients.

12. The method according to claim 11, further comprising determining the prescribed nonzero coefficients a and b as a function of a charge level of the battery when detecting the connection of the charge terminals to the charger.

13. The method according to claim 1, further comprising for the first charging of each respective cell of the battery:
detecting connection of the charging terminals to the charger,
to trigger, during a respective fourth phase, the disconnection of each respective cell from its respective bypass circuit to charge the respective cell until the voltage of the respective cell reaches the pre-set voltage;
then connecting, for at least one of the respective cells, at the end of the respective fourth phase, the respective bypass circuit to the respective cell for a respective third connection time so that the voltage of the respective cell does not exceed a threshold charge voltage during a respective charge maintaining third phase until the voltages of the respective cells have all reached the pre-set voltage,
wherein the respective first pre-emptive bypass time respectively associated with the respective cell, and valid for at least a second charging, corresponds to the respective third connection time of the respective bypass circuit to the respective cell during the respective charge maintaining third phase of the first charging.

14. The method according to claim 2, wherein the pre-set voltage is a voltage lower than or equal to the threshold charge voltage which is prescribed for the respective charge maintaining cell and which is nonzero.

15. A battery comprising respective cells, which are rechargeable, terminals for charging the respective cells and able to be connected to a charger, respective bypass circuits associated with the respective cells, switching elements allowing each respective cell to be connected and disconnected to and from its respective bypass circuit, control means to control the switching elements, means for measuring a voltage of each respective cell, wherein the control means comprise:
means to measure a respective total connection time, during which the respective bypass circuit is connected to the respective cell until all the cells reached a pre-set voltage, which is prescribed for the respective cell and is nonzero,
means to compute for each respective cell a respective first pre-emptive bypass time respectively associated with the respective cell for the $i^{th}$ charging where i≥2 as a function of the respective total connection time of at least one charging of the respective cell previous to the $i^{th}$ charging;

at least one memory to memorize at least one time period associated with the respective cell and representative of the respective first pre-emptive bypass time and/or of the respective total connection time;

a detector to detect connection of the charging terminals to the charger, the control means being designed to trigger, for the $i^{th}$ charging, the respective cells to be connected during the respective first pre-emptive bypass time to their respective bypass circuit in response to the fact that the detector has detected that the charging terminals are connected to the charger, the control means being designed to disconnect, at the end of the respective first pre-emptive bypass time, the respective bypass circuit from the respective cell during a second associated phase for the $i^{th}$ charging until the voltage of the respective cell reaches the pre-set voltage.

\* \* \* \* \*